(12) United States Patent
Nakajima et al.

(10) Patent No.: US 9,906,251 B2
(45) Date of Patent: *Feb. 27, 2018

(54) RECEPTION DEVICE AND ELECTRONIC APPARATUS

(71) Applicant: Sony Semiconductor Solutions Corporation, Kanagawa (JP)

(72) Inventors: Tomonori Nakajima, Tokyo (JP); Norihiro Murayama, Chiba (JP); Toshikazu Yoshida, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/291,861

(22) Filed: Oct. 12, 2016

(65) Prior Publication Data

US 2017/0033820 A1    Feb. 2, 2017

Related U.S. Application Data

(63) Continuation of application No. 14/766,909, filed as application No. PCT/JP2014/000405 on Jan. 28, 2014, now Pat. No. 9,484,972.

(30) Foreign Application Priority Data

Mar. 1, 2013  (JP) .................................. 2013-041070

(51) Int. Cl.
    *H04B 1/26* (2006.01)
    *H04B 1/16* (2006.01)
    (Continued)

(52) U.S. Cl.
    CPC ................. *H04B 1/16* (2013.01); *H03B 5/32* (2013.01); *H03L 7/24* (2013.01); *H04B 1/005* (2013.01); *H04N 21/42607* (2013.01)

(58) Field of Classification Search
    CPC . H04B 1/16; H04B 1/005; H04B 1/40; H04B 1/3822; H04B 1/406; H04B 1/44; H04B 1/54; H04N 21/42607; H03B 5/32
    (Continued)

(56) References Cited

U.S. PATENT DOCUMENTS 8,718,190 B2 * 5/2014 Chan ...................... H03C 1/547
                                                     375/295
8,869,213 B2   10/2014 Imai et al.
(Continued)

FOREIGN PATENT DOCUMENTS

CN       102474260 A    5/2012
JP       2002-152064 A  5/2002
(Continued)

*Primary Examiner* — Nhan Le
(74) *Attorney, Agent, or Firm* — Wolf, Greenfield & Sacks, P.C.

(57) ABSTRACT

There is provided a reception device including first and second reception circuits configured to receive transmission signals, a first oscillation circuit configured to generate a differential signal having a predetermined frequency on the basis of an oscillation signal acquired from a connected crystal oscillator, and to supply the generated differential signal to the first reception circuit as a reference frequency signal, and a second oscillation circuit configured to be supplied with an oscillation signal having one of phases in the differential signal acquired by the first oscillation circuit, to generate a differential signal having a predetermined frequency on the basis of the supplied oscillation signal, and to supply the generated differential signal to the second reception circuit as a reference frequency signal.

17 Claims, 8 Drawing Sheets

(51) Int. Cl.
  *H03L 7/24* (2006.01)
  *H04B 1/00* (2006.01)
  *H03B 5/32* (2006.01)
  *H04N 21/426* (2011.01)

(58) Field of Classification Search
  USPC ........ 455/75–77, 150.1, 160.1, 192.1, 193.1, 455/196.1, 313, 334
  See application file for complete search history.

(56) References Cited

U.S. PATENT DOCUMENTS

| | | |
|---|---|---|
| 9,479,722 B2 | 10/2016 | Tsukahara et al. |
| 9,484,972 B2 * | 11/2016 | Nakajima ................. H03L 7/24 |
| 2005/0281356 A1 | 12/2005 | Kim |
| 2006/0221905 A1 | 10/2006 | Behzad et al. |
| 2010/0259109 A1 | 10/2010 | Sato |
| 2010/0262846 A1 | 10/2010 | Sato |
| 2011/0142113 A1 | 6/2011 | Hokazono et al. |
| 2011/0247041 A1 | 10/2011 | Imai et al. |
| 2012/0113324 A1 | 5/2012 | Yoshida et al. |
| 2015/0319395 A1 | 11/2015 | Tsukahara et al. |
| 2015/0372704 A1 | 12/2015 | Nakajima et al. |
| 2015/0382049 A1 | 12/2015 | Fujii et al. |
| 2016/0028422 A1 | 1/2016 | Shimizu et al. |
| 2016/0142664 A1 | 5/2016 | Takiguchi et al. |

FOREIGN PATENT DOCUMENTS

| | | |
|---|---|---|
| JP | 2002-359556 A | 12/2002 |
| JP | 2003-218716 A | 7/2003 |

* cited by examiner

US 9,906,251 B2

RECEPTION DEVICE AND ELECTRONIC APPARATUS

CROSS-REFERENCE TO RELATED APPLICATIONS

This application is a continuation of and claims the benefit under 35 U.S.C. § 120 of U.S. patent application Ser. No. 14/766,909, titled "RECEPTION DEVICE AND ELECTRONIC APPARATUS" filed on Aug. 10, 2015, which is a National Stage of International Application No. PCT/JP2014/000405, filed in the Japanese Patent Office as a Receiving Office on Jan. 28, 2014, which claims priority to Japanese Patent Application Number JP 2013-041070, filed in the Japanese Patent Office on Mar. 1, 2013, each of which is hereby incorporated by reference in its entirety.

TECHNICAL FIELD

The present disclosure relates to a reception device that receives a transmission signal such as a television broadcasting signal, and an electronic apparatus including the reception device.

BACKGROUND ART

Devices including a plurality of reception circuits are developed today as television receivers and recording devices that include reception circuits which receive television broadcasting. For example, television receivers including a plurality of reception circuits can concurrently display reception images of a plurality of channels on the display screen. Meanwhile, recording devices including a plurality of reception circuits can concurrently record broadcasting signals of a plurality of channels.

FIG. 8 is a diagram illustrating an example of a conventional device including a plurality of reception circuits.

Signals received by an antenna 1 are supplied to a first tuner unit 2 and a second tuner unit 3. The first and second tuner units 2 and 3 individually include reception circuits 2a and 3a, respectively. Each of the reception circuits 2a and 3a receives a broadcasting signal of a specific channel (frequency). A channel received by each of the reception circuits 2a and 3a is decided, for example, on the basis of an instruction from a control unit in the device which is not illustrated.

Each of the reception circuits 2a and 3a acquires a baseband signal or an intermediate frequency signal converted from a broadcasting signal. To acquire such a baseband signal or intermediate frequency signal, a frequency signal (locally generated signal) is necessary which is mixed with a reception signal by a mixer (not illustrated) in the reception circuits 2a and 3a. A locally generated frequency signal that is mixed with a reception signal by this mixer is obtained by a phase locked loop (PLL) circuit multiplying reference frequency signals generated by oscillation circuits 2d and 3d built in the tuner units 2 and 3, respectively. The oscillation circuits 2d and 3d use crystal oscillators 2c and 3c to acquire reference frequency signals, the crystal oscillators 2c and 3c being connected to the oscillation circuits 2d and 3d, respectively.

Each of the reception circuits 2a and 3a then performs a demodulation process on a baseband signal or an intermediate frequency signal. An image signal and an audio signal obtained through this demodulation process are acquired by output terminals 2b and 3b of the reception circuits 2a and 3a.

Patent Literature 1 describes a technique of supplying oscillation signals of a single reference signal oscillation circuit to a plurality of PLL circuits via a buffer amplifier.

CITATION LIST

Patent Literature

Patent Literature 1: JP 2002-359556A

SUMMARY OF INVENTION

Technical Problem

When the plurality of tuner units 2 and 3 are installed as illustrated in FIG. 8, reference frequency signals supplied to the respective tuner units 2 and 3 have accuracy depending on the crystal oscillators 2c and 3c connected to the tuner units 2 and 3, respectively. Crystal oscillators generally have a frequency error from a few of ppm to several tens of ppm, and reference frequency signals acquired by the respective tuner units 2 and 3 also have some frequency errors.

Locally generated frequency signals that are mixed with reception signals by the respective tuner units 2 and 3 are generated by multiplying reference frequency signals. Accordingly, even a minor error in the reference frequency signals may cause a frequency difference of several MHz in locally generated signals for the respective tuner units 2 and 3 to receive the same channel.

If such locally generated signals having a frequency error of several MHz are used by the two neighboring tuner units 2 and 3, the respective locally generated signals leak to the other tuner unit.

Once such locally generated signals having slightly different frequencies leak to the other of the neighboring tuner unit 2 and 3, the leaked signals serve as false locally generated signals for a reception operation in some cases. If locally generated signals that are slightly different leak, circuits that generate locally generated signals interfere with each other. The generation of false locally generated signals and the mutual interference of locally generated frequency signal generating circuits as discussed above cause radio disturbance.

A phenomenon called injection locking is known as a problem with such two frequency signals having close frequencies. For example, if an oscillation frequency ωinj and an oscillation current Iinj are injected from the outside to an oscillation circuit that is oscillating at a free running frequency ω0 under an oscillation current Iosc, this oscillation circuit is pulled into the frequency ωinj, which is different from the original oscillation frequency ω0, and begins to oscillate at the frequency ωinj.

An object of the present disclosure is to provide a reception device and electronic apparatus that include a plurality of reception circuits and can prevent reference frequency signals from interfering with each other, the reference frequency signals being used by each reception circuit.

Solution to Problem

A reception device according to the present disclosure includes first and second reception circuits configured to receive transmission signals, and first and second oscillation circuits configured to supply reference frequency signals to the first and second reception circuits.

A first oscillation circuit generates a differential signal having a predetermined frequency on the basis of an oscillation signal acquired from a connected crystal oscillator, and supplies the generated differential signal to the first reception circuit as a reference frequency signal.

A second oscillation circuit is supplied with an oscillation signal having one of phases in the differential signal acquired by the first oscillation circuit, generates a differential signal having a predetermined frequency on the basis of the supplied oscillation signal, and supplies the generated differential signal to the second reception circuit as a reference frequency signal.

An electronic apparatus according to the present disclosure includes first and second reception circuits configured to receive transmission signals, first and second oscillation circuits configured to supply reference frequency signals to the first and second reception circuits, and a processing unit configured to process the transmission signals received by the first and second reception circuits.

A first oscillation circuit generates a differential signal on the basis of an oscillation signal acquired from a connected crystal oscillator, and supplies the generated differential signal to the first reception circuit as a reference frequency signal.

A second oscillation circuit is supplied with an oscillation signal having one of phases in the differential signal acquired by the first oscillation circuit, generates a differential signal having a predetermined frequency on the basis of the supplied oscillation signal, and supplies the generated differential signal to the second reception circuit as a reference frequency signal.

According to the present disclosure, the first oscillation circuit uses the connected crystal oscillator to generate a reference frequency signal as a differential signal. The second oscillation circuit is supplied with an oscillation signal alone that has one of phases in the differential signal output by the first oscillation circuit, and generates a reference frequency signal. Accordingly, the reference frequency signals of the oscillation circuits have the same frequency, thereby preventing radio disturbance due to an error in the reference frequency signals.

Advantageous Effects of Invention

According to the present disclosure, an oscillation circuit prepared for each reception circuit uses a frequency signal acquired from a single crystal oscillator to generate a reference frequency signal, causing no error in reference frequency signals and effectively avoiding radio disturbance due to the error in the reference frequency signals. Oscillation circuits included in a plurality of reception circuits use a common crystal oscillator, allowing the circuit configurations to be simple.

DESCRIPTION OF EMBODIMENTS

Figure 1:
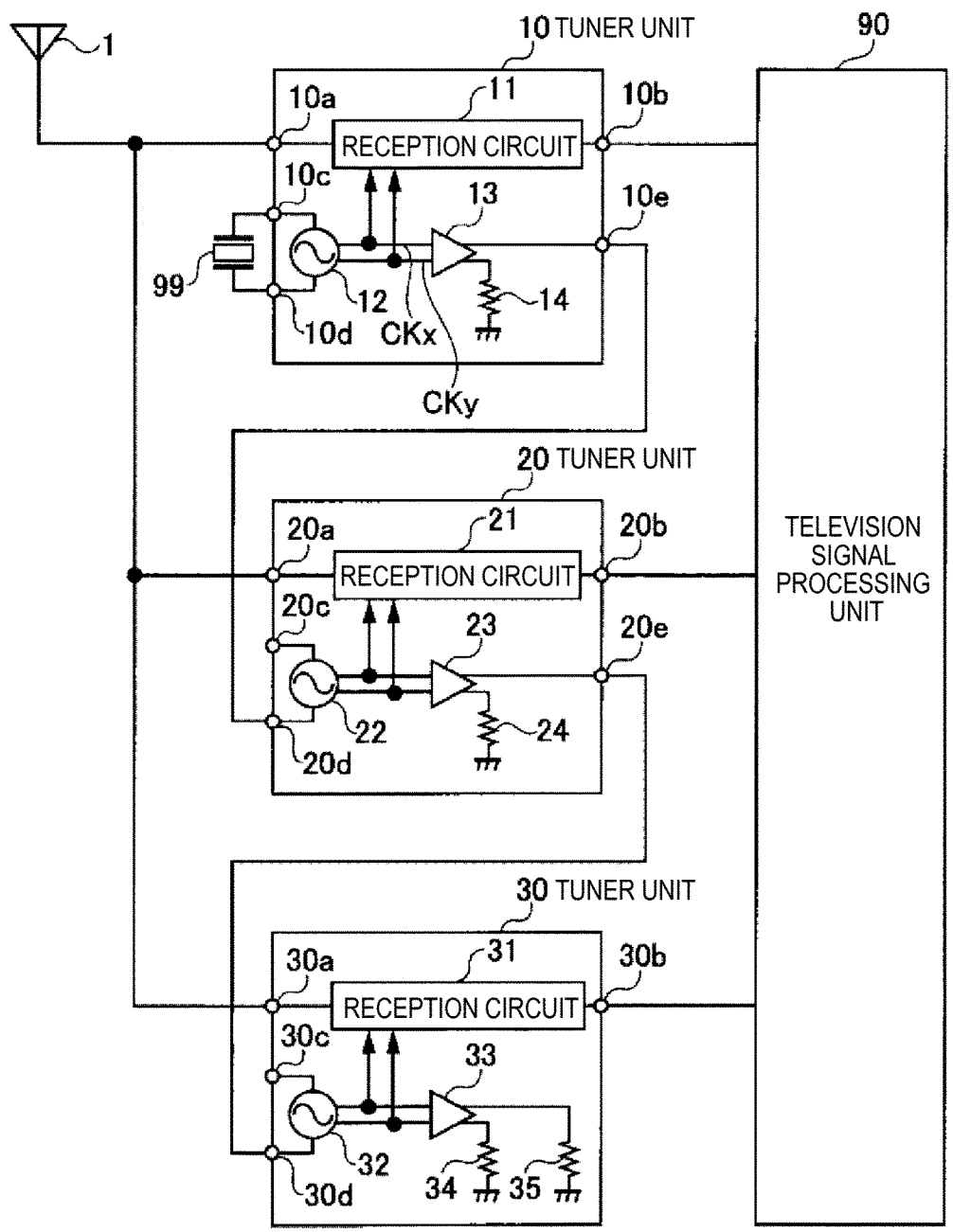
FIG. 1 is a circuit diagram illustrating an example of a configuration according to a first embodiment of the present disclosure.

Examples of a reception device and an electronic apparatus according to an embodiment of the present disclosure will be described in the following order with reference to the appended drawings.
1. Example of First Embodiment (FIGS. 1 to 4)
1. Modified Example of First Embodiment (FIG. 5)
3. Example of Second Embodiment (FIGS. 6 to 7)
4. Modified Example 1. Example of First Embodiment FIG. 1 is a diagram illustrating an example of a configuration of a reception device according to an example of a first embodiment of the present disclosure.

The reception device according to the present disclosure is a device that receives a television broadcasting signal, and includes a first tuner unit 10, a second tuner unit 20, and a third tuner unit 30. Signals received by an antenna 1 are supplied to input terminals 10a, 20a, and 30a of these tuner units 10, 20, and 30.

The tuner units 10, 20, and 30 individually include reception circuits 11, 21, and 31, respectively. Each of the reception circuits 11, 21, and 31 receives a broadcasting signal of a specific channel (frequency). A channel received by each of the reception circuits 11, 21, and 31 is decided, for example, on the basis of an instruction from a control unit that is not illustrated in the reception device. In this case, for example, the two reception circuits 11 and 21 can receive even the same channel.

Each of the reception circuits 11, 21, and 31 acquires, through a reception process, a baseband signal or an intermediate frequency signal obtained by performing frequency conversion on a broadcasting signal. Each of the reception circuits 11, 21, and 31 then performs a demodulation process on a baseband signal or an intermediate frequency signal. An image signal and an audio signal obtained through this demodulation process are supplied from output terminals 10b, 20b, and 30b of the tuner units 10, 20, and 30 to a television signal processing unit 90. The three tuner units 10, 20, and 30 are configured as individual integrated circuits. Alternatively, the three tuner units 10, 20, and 30 may be configured as a single integrated circuit.

Additionally, each of the tuner units 10, 20, and 30 is configured to perform a demodulation process on a reception signal in the example of FIG. 1, but each of the tuner units 10, 20, and 30 may also be configured not to perform a demodulation process. That is to say, each of the tuner units 10, 20, and 30 may be configured to output a baseband signal or an intermediate frequency signal, and a processing unit (television signal processing unit 90) connected to the later stage of the tuner units 10, 20, and 30 may be configured to perform a demodulation process.

Figure 2:
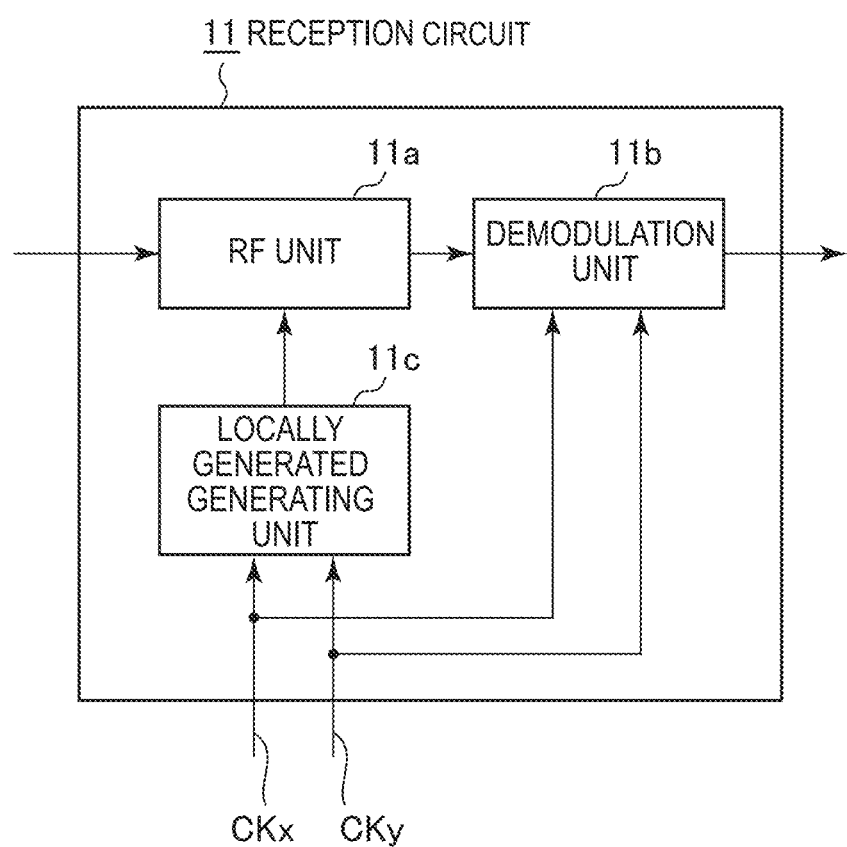
FIG. 2 is a block diagram illustrating an example of a reception circuit according to the first embodiment of the present disclosure.

FIG. 2 is a diagram illustrating an example of a reception circuit 11 included in the first tuner unit 10. Reception circuits 21 and 31 included in the second and third tuner units 20 and 30 are configured in the same way as the reception circuit 11.

The reception circuit 11 includes a radio frequency unit 11a that mixes a locally generated signal with a radio frequency signal to convert the locally generated signal into a baseband signal or an intermediate frequency signal, and a demodulation unit 11b that demodulates the baseband signal or the intermediate frequency signal acquired by the radio frequency unit 11a to acquire an image signal or an audio signal. As discussed above, the first tuner unit 10 includes the demodulation circuit 11b as an example, so that the tuner unit may also be configured without any demodulation circuit.

In addition, the reception circuit 11 includes a locally generated signal generating unit 11c that generates a locally generated signal that is mixed with a reception signal by the radio frequency unit 11a. A reference frequency signal is supplied to the locally generated signal generating unit 11c from an oscillation circuit 12 discussed below. In this case, a reference frequency signal supplied from the oscillation circuit 12 to the locally generated signal generating unit 11c is a differential signal including two signals CKx and CKy each of which has one of phases reversed to each other.

The locally generated signal generating unit 11c includes, for example, a PLL circuit and a frequency divider circuit, and generates a locally generated signal corresponding to a reception frequency from the reference frequency signal. The locally generated signal that is generated by the locally generated signal generating unit 11c is supplied to the radio frequency unit 11a.

The demodulation unit 11b performs a demodulation process and a decoding process corresponding to a modulation scheme of a received broadcasting signal. When these demodulation process and decoding process are performed, the reference frequency signal supplied from the oscillation circuit 12 is used as a clock. A reference frequency signal for this demodulation unit 11b to perform a demodulation process and a decoding process is also a differential signal including two signals CKx and CKy each of which has one of phases reversed to each other.

Returning to the description of FIG. 1, the first tuner unit 10 includes the oscillation circuit 12, which generates a reference frequency signal. Connected to the oscillation circuit 12 is a crystal oscillator 99 via terminals 10c and 10d. An oscillation signal obtained by applying voltage to the crystal oscillator 99 is extracted by the oscillation circuit 12 as a reference frequency signal. A reference frequency signal output by the oscillation circuit 12 is a differential signal including two signals CKx and CKy each of which has one of phases reversed to each other as discussed above.

The reference frequency signal generated by the oscillation circuit 12 is supplied to the reception circuit 11. The demodulation unit 11b and the locally generated signal generating unit 11c in the reception circuit 11 perform a process using the reference frequency signal.

In addition, the reference frequency signal generated by the oscillation circuit 12 is supplied to an amplifier circuit 13. The amplifier circuit 13 amplifies the reference frequency signal serving as a differential signal.

A reference frequency signal (e.g. signal CKx) having one of the phases in the differential signal amplified by the amplifier circuit 13 of the first tuner unit 10 is then output from a terminal 10e, and supplied to a terminal 20d of the second tuner unit 20. Meanwhile, a termination resistor 14 is, for example, connected to an output unit for a reference frequency signal (e.g. signal CKy) having the other phase in the differential signal amplified by the amplifier circuit 13. Connecting the termination resistor 14 to an output unit including no connection at the later stage is an example, so that nothing may be connected to an output unit including no connection at the later stage. Other termination resistors 24, 34, 35, 44, and 45 discussed below are configured to be connected thereto as an example, but nothing may also be connected.

The reference frequency signal acquired by the terminal 20d of the second tuner unit 20 is supplied to an oscillation circuit 22 in the second tuner unit 20. The oscillation circuit 22 generates, from a reference frequency signal having one of phases in the differential signal acquired by this terminal 20d, a differential signal having the same frequency. The reference frequency signal generated by the oscillation circuit 22 is then supplied to the reception circuit 21, and a reception process is performed using the reference frequency signal in the reception circuit 21.

In addition, the reference frequency signal generated by the oscillation circuit 22 is supplied to an amplifier circuit 23. The amplifier circuit 23 amplifies the reference frequency signal serving as a differential signal.

A reference frequency signal having one of phases in the differential signal amplified by the amplifier circuit 23 of the second tuner unit 20 is then output from a terminal 20e, and supplied to a terminal 30d of the third tuner unit 30. Meanwhile, a termination resistor 24 is, for example, connected to an output unit for a reference frequency signal having the other phase in the differential signal amplified by the amplifier circuit 23.

The reference frequency signal acquired by the terminal 30d of the third tuner unit 30 is supplied to an oscillation circuit 32 in the third tuner unit 30. The oscillation circuit 32 generates, from a reference frequency signal having one of phases in the differential signal acquired by this terminal 30d, a differential signal having the same frequency. The reference frequency signal generated by the oscillation circuit 32 is then supplied to the reception circuit 31, and a reception process is performed using the reference frequency signal in the reception circuit 31.

In addition, the reference frequency signal generated by the oscillation circuit 32 is supplied to an amplifier circuit 33. The amplifier circuit 33 amplifies the reference frequency signal serving as a differential signal. Termination resistors 34 and 35 are, for example, connected to an output unit for the differential signal amplified by this amplifier circuit 33.

The terminal resistors 34 and 35 do not have to be connected to the third tuner unit 30, which is the last tuner unit in a cascade connection, but the amplifier circuit 33 may be configured to enter a sleep state.

Additionally, the termination resistors 14, 24, 34, and 35 that are connected to the amplifier circuits 13, 23, and 33 may also be configured to be connected to the outside of each of the tuners 10, 20, and 30.

Image signals and audio signals acquired by the output terminals 10b, 20b, and 30b of the tuner units 10, 20, and 30 are then supplied to the television signal processing unit 90.

If the reception device according to the present disclosure is a television receiver, the television signal processing unit 90 performs a process for displaying an image and a process for outputting a sound.

Meanwhile, if the reception device according to the present disclosure is a video recording device, the television signal processing unit 90 performs a process for recording an image signal and an audio signal.

This reception device according to the present disclosure illustrated in FIG. 1 includes the three tuner units 10, 20, and 30, but reference frequency signals used by these three tuner units 10, 20, and 30 to perform signal processing are oscillation signals acquired from a single crystal oscillator 99. The reference frequency signals acquired by the oscillation circuits 12, 22, and 32 in the three tuner units 10, 20, and 30 thus have completely the same frequency.

That is to say, the oscillation circuit 12 in the first tuner unit 10 includes the crystal oscillator 99 and generates a reference frequency signal that is a differential signal, but the oscillation circuit 22 in the second tuner unit 20 is supplied from the oscillation circuit 12 in the first tuner unit 10 with a signal having one of phases in the differential signal. The oscillation circuit 32 in the third tuner unit 30 is supplied from the oscillation circuit 22 in the second tuner unit 20 with a signal having one of phases in the differential signal. Thus, the three oscillation circuits 12, 22, and 32 generate reference frequency signals that are based on the same oscillation signal and have completely the same frequency.

Accordingly, the reception device according to the present disclosure has no error in reference frequency signals in the three tuner units 10, 20, and 30, causing no radio disturbance due to the error in the reference frequency signals.

Figure 3:
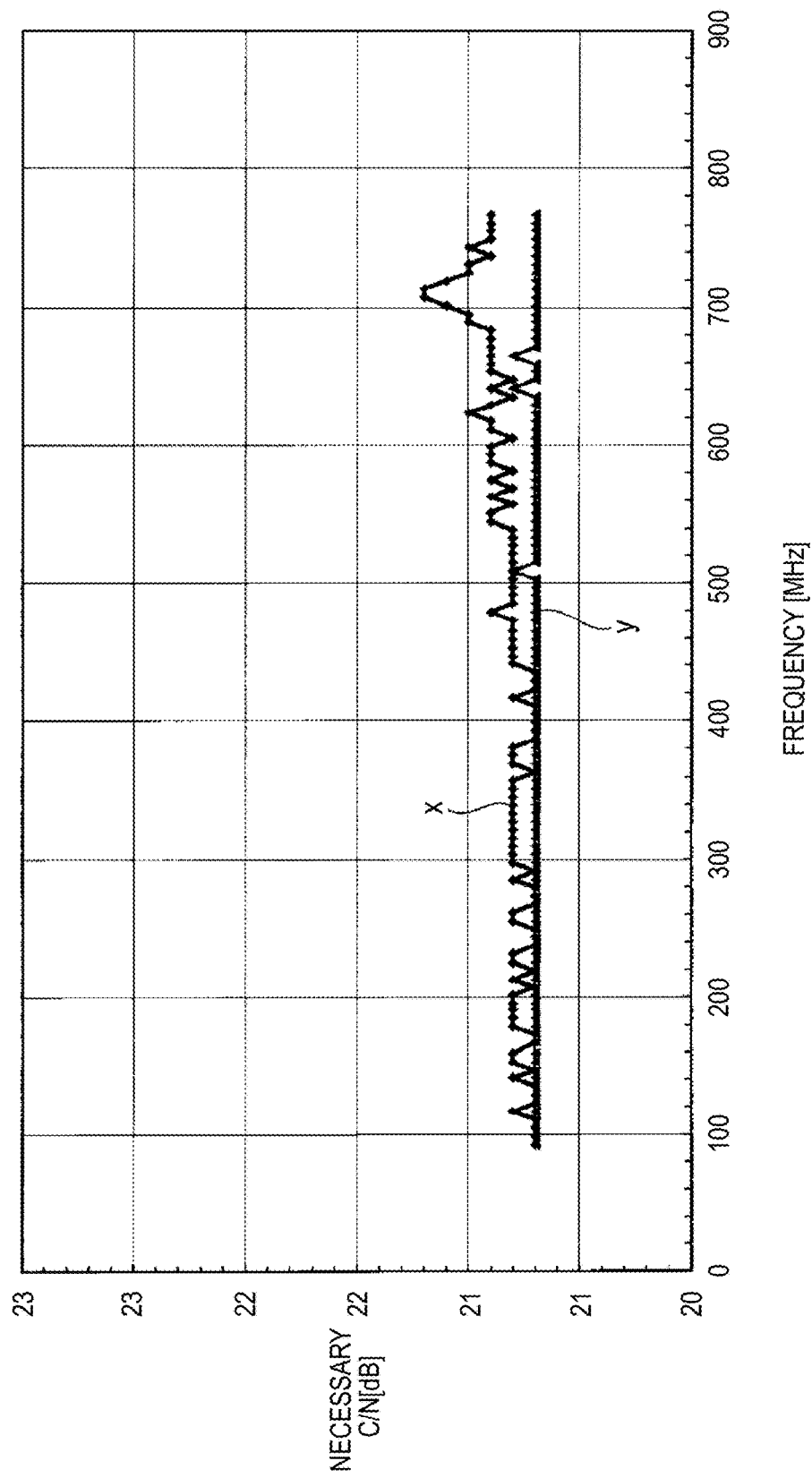
FIG. 3 is a frequency characteristic diagram illustrating an example of a characteristic (advantageous effect attained by sharing a crystal oscillator) according to the first embodiment of the present disclosure.

FIG. 3 is a diagram illustrating advantageous effects attained by sharing the crystal oscillator 99 among the oscillation circuits 12, 22, and 32 of the tuner units 10, 20, and 30 in the reception device according to the present disclosure. The horizontal axis represents a frequency in FIG. 3, while the vertical axis represents necessary C/N [dB]. The necessary C/N uses a ratio of signals (carriers) to noise to show to what extent a signal is distortionless (clear) with respect to a reception signal necessary for each tuner unit to perform a reception process. Smaller value of the necessary C/N of the tuner unit shows higher performance that allows even a distorted reception signal to be demodulated.

A characteristic x illustrated in FIG. 3 shows the necessary C/N [dB] at respective frequencies for a different crystal oscillator included in a neighboring tuner unit, and a characteristic y shows the necessary C/N [dB] at respective frequencies for a common crystal oscillator used by a neighboring tuner unit. As illustrated in FIG. 3, the characteristic y of the reception device according to the present disclosure, in which a neighboring tuner unit uses a common crystal oscillator, shows a lower necessary C/N and higher reception performance at any frequency than the characteristic x for a different crystal oscillator.

Figure 4:
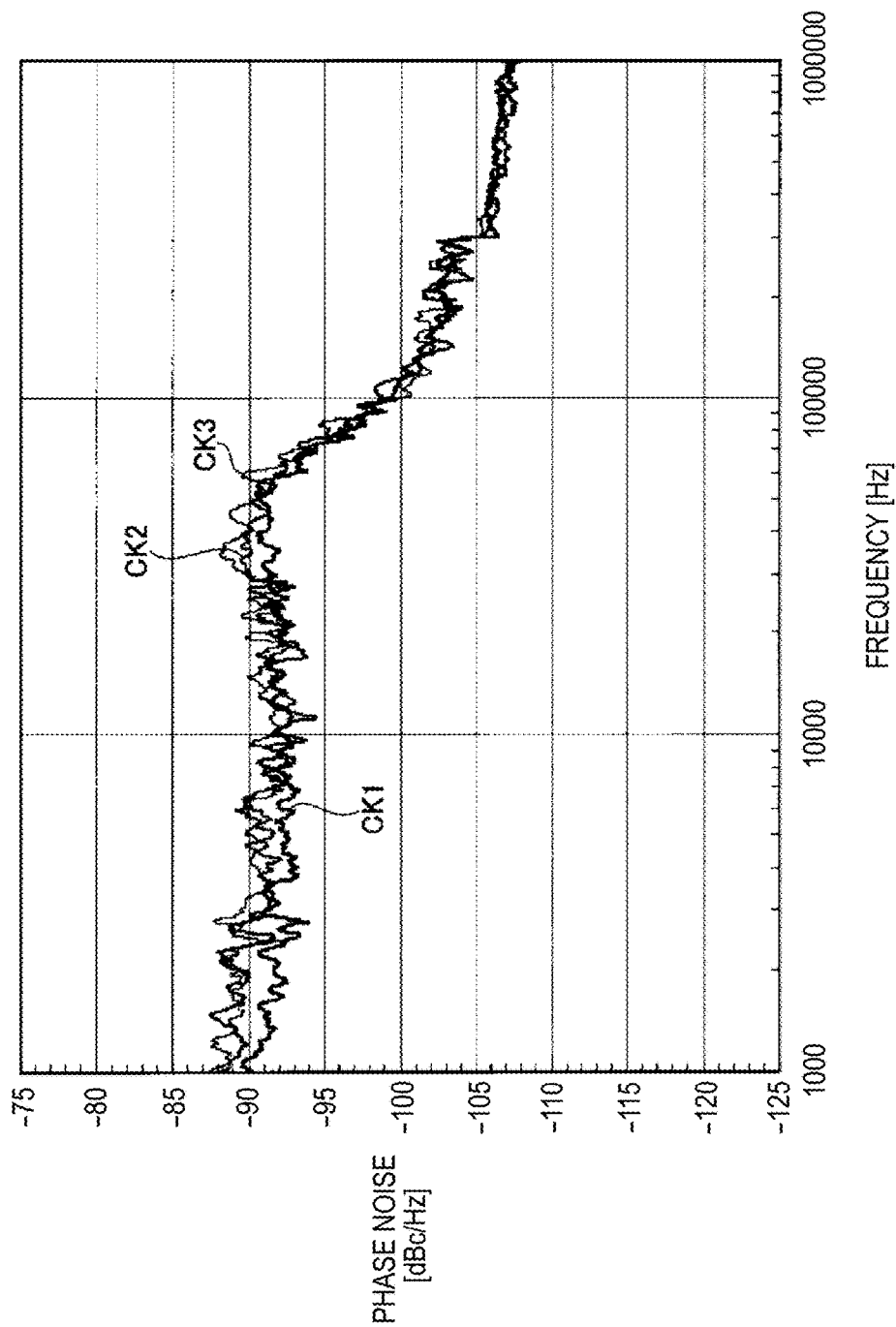
FIG. 4 is a frequency characteristic diagram illustrating an example of a characteristic (example of a change in noise of an oscillation signal in a tuner unit at each stage) according to the first embodiment of the present disclosure.

FIG. 4 is a diagram illustrating a change in phase noise included in reference frequency signals generated by the oscillation circuits 12, 22, and 32 of the tuner units 10, 20, and 30 in the reception device according to the present disclosure. The horizontal axis represents a frequency in FIG. 4, and the vertical axis represents phase noise [dBc/Hz]. Characteristics CK1, CK2, and CK3 show reference frequency signals output by the oscillation circuits 12, 22, and 32, respectively.

The reception device according to the present disclosure supplies a reference frequency signal generated by the oscillation circuit 12 in the first tuner unit 10 to the second tuner unit 20, and further supplies a reference frequency signal generated by the oscillation circuit 22 in the second tuner unit 20 to the third tuner unit 30. Sending reference frequency signals sequentially in this way gradually increases phase noise of the reference frequency signals.

That is to say, as illustrated in FIG. 4, the phase noise CK2 of a reference frequency signal generated by the oscillation circuit 22 in the second tuner unit 20 is deteriorated by about 1.6 [dBc/Hz] on average as compared to the phase noise CK1 of a reference frequency signal generated by the oscillation circuit 12 in the first tuner unit 10. Meanwhile, the phase noise CK3 of a reference frequency signal generated by the oscillation circuit 32 in the third tuner unit 30 is deteriorated by about 1.6 [dBc/Hz] on average as compared to the phase noise CK2 of a reference frequency signal generated by the oscillation circuit 22 in the second tuner unit 20.

In this way, sequentially sending reference frequency signals to the tuner units at the next stages deteriorates phase noise of a reference frequency signal acquired by the tuner unit by about 1.6 [dBc/Hz] at each stage.

2. Modified Example of First Embodiment

Figure 5:
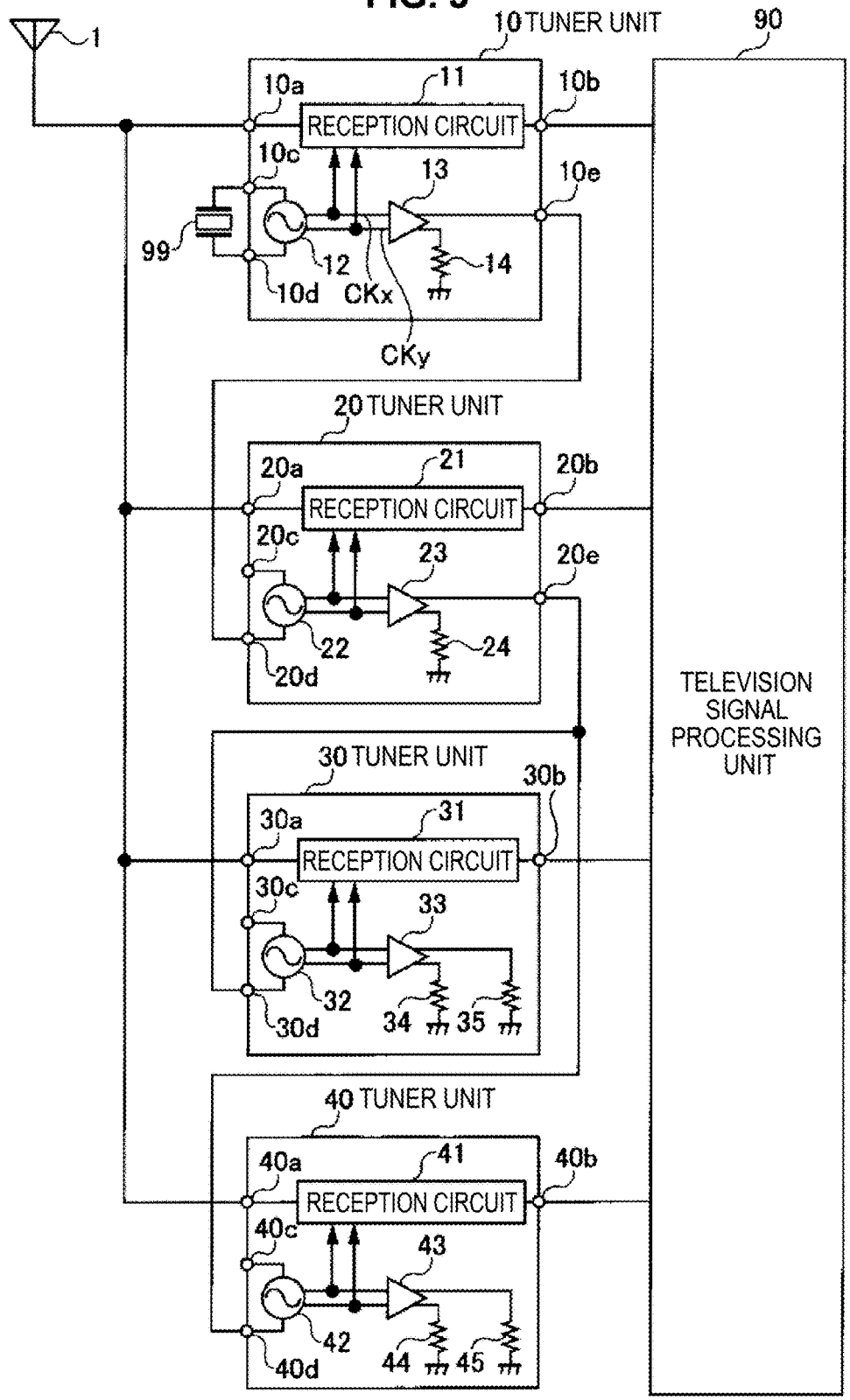
FIG. 5 is a circuit diagram illustrating an example (modified example) of a configuration according to the first embodiment of the present disclosure.

FIG. 5 is a diagram illustrating a modified example of the configuration of the reception device according to the example of the first embodiment of the present disclosure.

The reception device according to the example of FIG. 5 is obtained by further adding a fourth tuner unit 40 to the reception device including the first to third tuner units 10, 20, and 30 illustrated in FIG. 1.

A reference frequency signal (signal having one of phases in a differential signal) output from the terminal 20e of the second tuner unit 20 is divided into two, and supplied to the third tuner unit 30 and the fourth tuner unit 40 in the example of FIG. 5.

The fourth tuner unit 40 is configured in the same way as the first to third tuner units 10, 20, and 30, and includes a reception circuit 41, an oscillation circuit 42, and an amplifier circuit 43. The oscillation circuit 42 generates a differential signal on the basis of a reference frequency signal (signal having one of the phases in a differential signal) acquired by a terminal 40d, and the differential signal is supplied to the reception circuit 41 and the amplifier circuit 43.

Termination resistors 44 and 45 are, for example, connected to an output unit for an amplified signal of the amplifier circuit 43 of the fourth tuner unit 40. No termination resistor has to be connected to this fourth tuner unit 40 as with the third tuner unit 30 described with reference to FIG. 1, and the amplifier circuit 43 may enter a sleep state.

An image signal and an audio signal received by the reception circuit 41 of the fourth tuner unit 40 and acquired by the output terminal 40b are then supplied to the television signal processing unit 90.

The other parts in FIG. 5 are configured in the same way as those of the reception device illustrated in FIG. 1.

As illustrated in FIG. 5, dividing and supplying a reference frequency signal output by the second tuner unit 20 to a plurality of tuner units 30 and 40 make it possible to supply a reference frequency signal to more tuner units.

3. Example of Second Embodiment

Next, an example of a second embodiment of the present disclosure will be described with reference to FIGS. 6 and 7. The parts that have been described in the first embodiment and correspond to those of FIGS. 1 to 5 are denoted with the same reference numerals in FIGS. 6 and 7.

Figure 6:
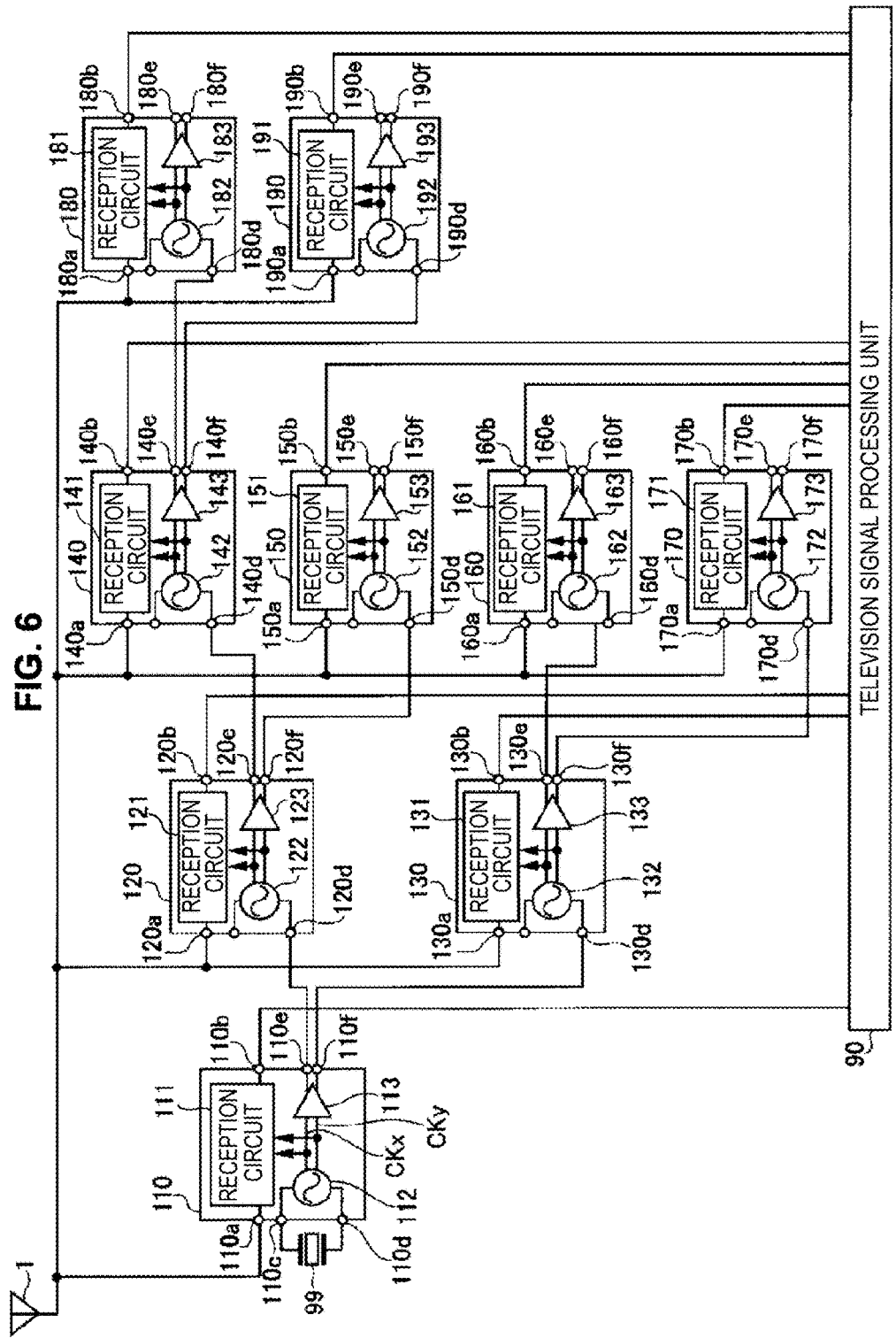
FIG. 6 is a circuit diagram illustrating an example of a configuration according to a second embodiment of the present disclosure.

FIG. 6 is a diagram illustrating an example of a configuration of a reception device according to an example of the second embodiment of the present disclosure.

The reception device according to the example of the second embodiment of the present disclosure is also a device that receives a television broadcasting signal, and includes first to ninth tuner units 110 to 190. A signal received by the antenna 1 is divided and supplied to input terminals 110a to 190a of these tuner units 110 to 190.

The tuner units 110 to 190 include reception circuits 111 to 191, respectively. Each of the reception circuits 111 to 191 receives a broadcasting signal of a specific channel (frequency), and image signals and audio signals obtained through the reception are outputted from output terminals 110b to 190b. A channel received by each of the reception circuits 111 to 191 is decided, for example, on the basis of an instruction from a control unit that is not illustrated in the reception device.

Each of the tuner units 110 to 190 is configured in the same way as each of the tuner units 10 to 30 illustrated in FIG. 1 for the example of the first embodiment. That is to say, each of the reception circuits 111 to 191 acquires a baseband signal or an intermediate frequency signal converted from a broadcasting signal. Each of the reception circuits 111 to 191 then performs a decoding process on a baseband signal or an intermediate frequency signal. An image signal and an audio signal obtained through this demodulation process are supplied from the output terminals 110b to 190b of the reception circuits 111 to 191 to the television signal processing unit 90. The nine tuner units 110 to 190 are configured as individual integrated circuits. Alternatively, the nine tuner units 110 to 190 may be configured as a single integrated circuit.

Each of the tuner units 110 to 190 may also be configured not to perform a demodulation process in this example of FIG. 6. That is to say, each of the tuner units 110 to 190 may be configured to output a baseband signal or an intermediate frequency signal, and a processing unit connected to the later stage of the tuner units 110 to 190 may be configured to perform a demodulation process.

The tuner units 110 to 190 include oscillation circuits 112 to 192, respectively, each of which generates a reference frequency signal, and the reception circuits 111 to 191 in each tuner unit 110 generate reference frequency signals necessary for signal processing.

In this case, connected to the oscillation circuit 112 of the first tuner unit 110 is the crystal oscillator 99 via terminals 110c and 110d. The oscillation circuit 112 uses an oscillation signal obtained by applying voltage to the crystal oscillator 99 as a reference frequency signal. A reference frequency signal output by the oscillation circuit 112 is a differential signal including two signals CKx and CKy each of which has one of phases reversed to each other.

The reference frequency signal generated by the oscillation circuit 112 is supplied to the reception circuit 111. The reception circuit 111 performs a reception process using the reference frequency signal.

In addition, the reference frequency signal generated by the oscillation circuit 112 is supplied to an amplifier circuit 113. The amplifier circuit 113 amplifies the reference frequency signal serving as a differential signal.

A reference frequency signal (e.g. signal CKx) having one of phases in the differential signal amplified by the amplifier circuit 113 of the first tuner unit 110 is then output from a terminal 110e, and supplied to a terminal 120d of the second tuner unit 120. A reference frequency signal (e.g. signal CKy) having the other phase in the differential signal amplified by the amplifier circuit 113 is output from a terminal 110f, and supplied to a terminal 130d of the third tuner unit 130.

In this way, a reference frequency signal generated by each tuner unit 110 is sequentially supplied to the tuner units 120, 130, and so on at the later stage. A path through which a reference frequency signal is supplied will be described below. A reference frequency signal having one of phases in the differential signal amplified by the amplifier circuit 123 of the second tuner unit 120 is supplied from a terminal 120e to a terminal 14d of the fourth tuner unit 140. A reference frequency signal having the other phase in the differential signal amplified by the amplifier circuit 123 is supplied from a terminal 120f to a terminal 150d of the fifth tuner unit 150.

A reference frequency signal having one of phases in the differential signal amplified by the amplifier circuit 133 of the third tuner unit 130 is supplied from a terminal 130e to a terminal 160d of the sixth tuner unit 160. A reference frequency signal having the other phase in the differential signal amplified by the amplifier circuit 133 is supplied from a terminal 130f to a terminal 170d of the seventh tuner unit 170.

Furthermore, a reference frequency signal having one of phases in the differential signal amplified by the amplifier circuit 143 of the fourth tuner unit 140 is supplied from a terminal 140e to a terminal 180d of the eighth tuner unit 180. A reference frequency signal having the other phase in the differential signal amplified by the amplifier circuit 143 is supplied from a terminal 140f to a terminal 190d of the ninth tuner unit 190.

Image signals and audio signals acquired by the output terminals 110b to 190b of the tuner units 110 to 190 are then supplied to the television signal processing unit 90.

Although FIG. 6 illustrates no termination resistor, termination resistors similar to the termination resistors 34 and 35 in the example of FIG. 1 may also be, for example, installed at the tuner units 150, 160, 170, 180, and 190, which do not have another tuner unit connected thereto at the later stage. Alternatively, no termination resistor may also be configured to be connected thereto. The tuner units 150, 160, 170, 180, and 190, which do not have another tuner unit connected thereto at the later stage, may also have the amplifier circuits 153, 163, 173, 183, and 193 enter a sleep state, respectively. No termination resistor has to be connected in the sleep state.

This reception device according to the present disclosure illustrated in FIG. 6 includes the nine tuner units 110 to 190, but reference frequency signals used by these nine tuner units 110 to 190 to perform signal processing are oscillation signals acquired from a single crystal oscillator 99. The reference frequency signals acquired by the oscillation circuits 112 to 192 in the nine tuner units 110 to 190 thus have completely the same frequency.

Accordingly, the reception device according to the present disclosure has no error in reference frequency signals in the nine tuner units 110 to 190, causing no radio disturbance due to the error in the reference frequency signals.

Furthermore, a signal having one of phase and a signal having the other phase in a reference frequency signal (signal having one of the phases in a differential signal) that is a differential signal generated by a single tuner unit (e.g. tuner unit 110) are supplied to two other tuner units (e.g. tuner units 120 and 130) in the example of FIG. 6. Accordingly, the oscillation circuits 112 to 192 in the tuner units 110 to 190 and the amplifier circuits 113 to 193 that amplify reference frequency signals can output differential signals without converting them into single type signals. There is no need to convert differential signals into single type signals, so that it is possible to simplify the circuit configurations and to prevent signals from being deteriorated in conversion. In addition, all the tuner units 110 to 190 can acquire reference frequency signals having preferable characteristics.

When a differential signal is supplied from the tuner unit at each stage to the tuner unit at the later stage, it is preferable to transmit a signal having each phase included in the differential signal through signal lines disposed as close as possible.

Figure 7:
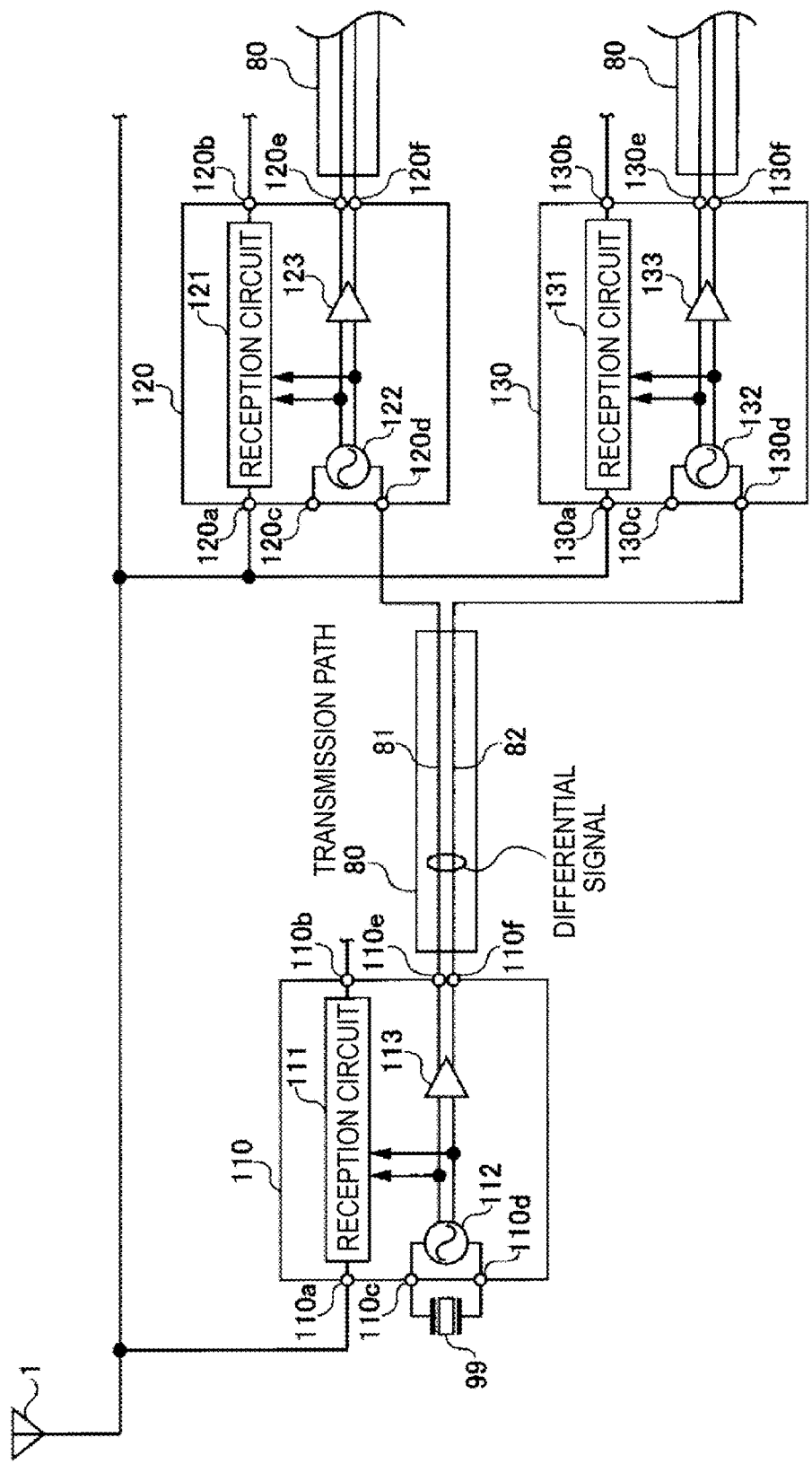
FIG. 7 is a circuit diagram illustrating an example of disposition of a transmission path according to the second embodiment of the present disclosure.
Figure 8:
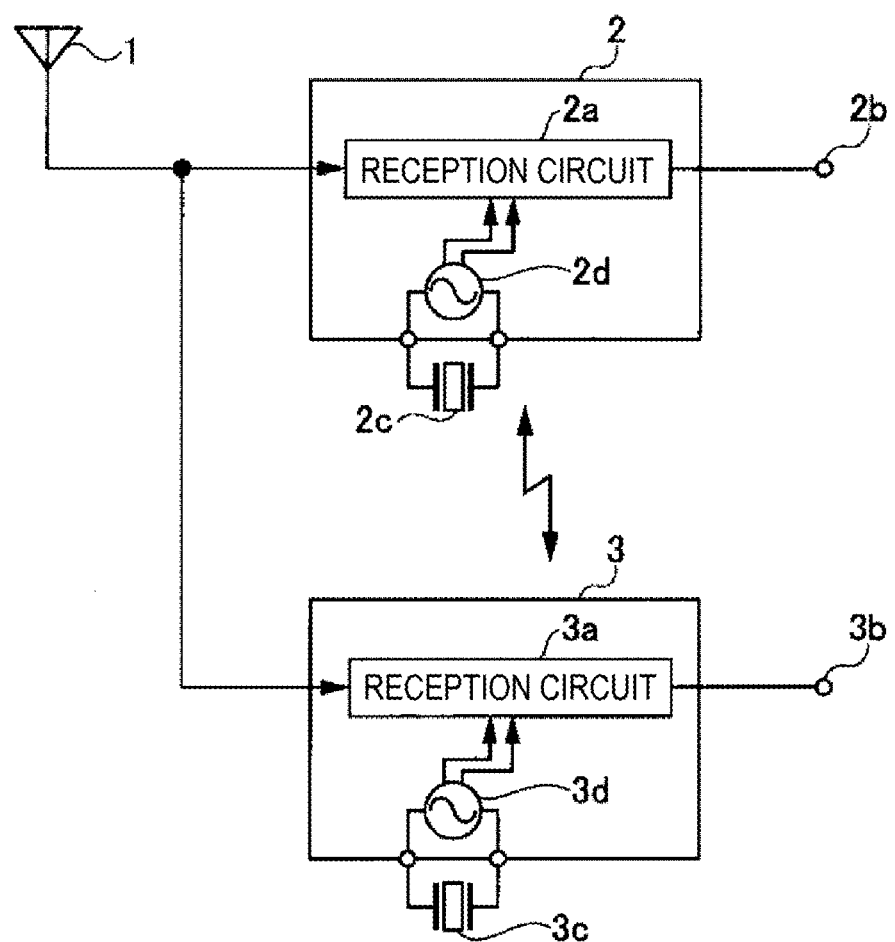
FIG. 8 is a circuit diagram illustrating an example of a conventional reception device.

For example, as illustrated in FIG. 7, a transmission path 80 in which two signal lines 81 and 82 are close is used to supply differential signals (reference frequency signals) output from the terminals 110e and 110f of the first tuner unit 110 around the second and third tuner units 120 and 130. In this case, it is preferable to dispose the second and third tuner units 120 and 13, to which these differential signals are supplied, at close positions on a substrate, and to transmit the differential signals to as close positions as possible to the terminals 120a and 130a of the tuner units 120 and 130 through the transmission path 80.

A differential signal output from the second tuner unit 120 and a differential signal output from the third tuner unit 130 are also transmitted through the transmission line 80 in which two signal lines are similarly close.

Transmission in a differential signal scheme as illustrated in FIG. 7 causes two differential signals to reverse and neutralize magnetic fields and electric fields generated by the transmission, thereby providing a preferable characteristic with effects from the noise reduced. Thus, a reference frequency signal used by each of the tuner units 110 to 190 has a preferable characteristic.

4. Modified Example

Additionally, the number of tuner units disposed in the example of each of the embodiments illustrated in FIGS. 1 and 6 is a preferred example. Any other number of tuner units may also be disposed. A reference frequency signal generated by an oscillation circuit in a tuner unit is amplified by an amplifier circuit, and supplied to the tuner unit at the later stage in each example. However, a reference frequency signal may also be supplied to the tuner unit at the later stage without being amplified by an amplifier circuit.

Signals received by a single antenna 1 are supplied to the tuner units 10 to 40 and 110 to 190 in the respective examples of FIGS. 1, 5, and 6. However, for example, the respective tuner units may also serve as both of tuners that receive terrestrial broadcasting signals and tuners that receive satellite broadcasting signals, and a plurality of antennas may be connected thereto. Alternatively, a first group of tuner units in a plurality of tuner units may serve as tuner units that receive terrestrial broadcasting signals, and a second group of tuner units may serve as tuner units that receive satellite broadcasting signals.

Additionally, the present technology may also be configured as below.

(1)

A reception device including:

first and second reception circuits configured to receive transmission signals;

a first oscillation circuit configured to generate a differential signal having a predetermined frequency on the basis of an oscillation signal acquired from a connected crystal oscillator, and to supply the generated differential signal to the first reception circuit as a reference frequency signal; and a second oscillation circuit configured to be supplied with an oscillation signal having one of phases in the differential signal acquired by the first oscillation circuit, to generate a differential signal having a predetermined frequency on the basis of the supplied oscillation signal, and to supply the generated differential signal to the second reception circuit as a reference frequency signal.

(2)

The reception device according to (1), further including:

a third reception circuit configured to receive a transmission signal; and a third oscillation circuit configured to be supplied with an oscillation signal having other of the phases in the differential signal acquired by the first oscillation circuit, to generate a differential signal having a predetermined frequency on the basis of the supplied oscillation signal, and to supply the generated differential signal to the third reception circuit as a reference frequency signal.

(3)

The reception device according to (2), wherein a signal line that transmits the oscillation signal having the one of the phases from the first oscillation circuit to the second oscillation circuit is at least partially disposed close to a signal line that transmits the oscillation signal having the other of the phases from the first oscillation circuit to the third oscillation circuit.

(4)

The reception device according to (2) or (3), further including:

a fourth reception circuit configured to receive a transmission signal; and a fourth oscillation circuit configured to be supplied with an oscillation signal having one of phases in the differential signal acquired by the second oscillation circuit, to generate a differential signal having a predetermined frequency on the basis of the supplied oscillation signal, and to supply the generated differential signal to the fourth reception circuit as a reference frequency signal.

(5)

The reception device according to any one of (1) to (5), including:

an amplifier circuit configured to amplify the differential signal acquired by the first oscillation circuit, wherein an oscillation signal having one of phases in the differential signal amplified by the amplifier circuit is supplied to the second oscillation circuit.

(6)

The reception device according to any one of (1) to (5), including:

a termination resistor configured to be connected to an output unit of the amplifier circuit for an oscillation signal having other of the phases.

(7)

An electronic apparatus including:

first and second reception circuits configured to receive transmission signals;

a first oscillation circuit configured to generate a differential signal having a predetermined frequency on the basis of an oscillation signal acquired from a connected crystal oscillator, and to supply the generated differential signal to the first reception circuit as a reference frequency signal;

a second oscillation circuit configured to be supplied with an oscillation signal having one of phases in the differential signal acquired by the first oscillation circuit, to generate a differential signal having a predetermined frequency on the basis of the supplied oscillation signal, and to supply the generated differential signal to the second reception circuit as a reference frequency signal; and a processing unit configured to process the transmission signals received by the first and second reception circuits.

Furthermore, the configurations and processes recited in the claims of the present disclosure are not limited to the examples of the embodiments described above. It is obvious to those skilled in the art that various modifications, combinations, and other embodiments are possible insofar as they are within the technical scope of the appended claims

REFERENCE SIGNS LIST 1 antenna
10, 20, 30, 40, 110, 120, 130, 140, 150, 160, 170, 180 tuner unit
11, 21, 31, 41, 111, 121, 131, 141, 151, 161, 171, 181 reception circuit
12, 22, 32, 42, 112, 122, 132, 142, 152, 162, 172, 182 oscillation circuit
13, 23, 33, 43, 113, 123, 133, 143, 153, 163, 173, 183 amplifier circuit
11a radio frequency unit
11b modulation unit
11c locally generated signal generating unit
14, 24, 34, 35 termination resistor
80 transmission path
81, 82 signal line
90 television signal processing unit
99 crystal oscillator

The invention claimed is:

1. A receiver comprising:
a first tuner comprising a first reception circuit coupled to a first oscillation circuit, wherein the first oscillation circuit is configured to receive an oscillation signal from a crystal oscillator and generate a first differential reference signal comprising a first signal having a first phase and a second signal having a second phase; and
a second tuner comprising a second reception circuit coupled to a second oscillation circuit, wherein the second oscillation circuit is configured to generate a second differential reference signal comprising a third signal having a third phase and a fourth signal having a fourth phase, wherein only the first signal of the first differential reference signal is provided to the second oscillation circuit for a reference frequency signal.

2. The receiver of claim 1, wherein only the first signal is provided to at least one additional tuner as a reference frequency signal.

3. The receiver of claim 1, further comprising:
a first amplifier arranged to receive the first differential reference signal; and
a second amplifier arranged to receive the second differential reference signal.

4. The receiver of claim 3, wherein one output of the first amplifier is connected to the second oscillation circuit, and a second output of the first amplifier is terminated with a resistor.

5. The receiver of claim 1, further comprising a third tuner comprising a third reception circuit coupled to a third oscillation circuit, wherein the third oscillation circuit is configured to generate a third differential reference signal comprising a fifth signal having a fifth phase and a sixth signal having a sixth phase, wherein only one of the third signal or the fourth signal is provided to the third oscillation circuit as a reference frequency signal.

6. The receiver of claim 5, further comprising a third amplifier arranged to receive the third differential reference signal.

7. The receiver of claim 6, wherein the third amplifier is configured to enter a sleep state.

8. The receiver of claim 6, wherein two outputs of the third amplifier are terminated with two resistors.

9. The receiver of claim 5, wherein the first tuner, the second tuner, and the third tuner are connected to receive a same signal from an antenna.

10. The receiver of claim 1, wherein the first reception circuit comprises a signal demodulator.

11. The receiver of claim 1, further comprising a television signal processor coupled to a first output from the first tuner and to a second output from the second tuner.

12. The receiver of claim 1, further comprising a third tuner comprising a third reception circuit coupled to a third oscillation circuit, wherein the third oscillation circuit is configured to generate a third differential reference signal comprising a fifth signal having a fifth phase and a sixth signal having a sixth phase, wherein only the second signal is provided to the third oscillation circuit as a reference frequency signal.

13. The receiver of claim 12, wherein the phase of the second signal is reversed the phase of the first signal.

14. The receiver of claim 12, further comprising a plurality of additional tuners each configured to receive one signal from among the third signal, the fourth signal, the fifth signal, and the sixth signal.

15. The receiver of claim 14, wherein the first tuner, the second tuner, the third tuner, and the plurality of additional tuners are connected to receive a same signal from an antenna.

16. The receiver of claim 14, further comprising a television signal processor coupled to outputs from the first tuner, the second tuner, the third tuner, and the plurality of additional tuners.

17. The receiver of claim 12, further comprising:
a first amplifier arranged to receive the first differential reference signal;
a first signal path connecting a first output from the first amplifier to an input of the second oscillation circuit; and
a second signal path connecting a second output from the first amplifier to an input of the third oscillation circuit, wherein at least a portion of the first signal path is located in close proximity to at least a portion of the second signal path along a differential signal transmission path.

* * * * *